(12) United States Patent
Hirose

(10) Patent No.: US 6,518,197 B2
(45) Date of Patent: Feb. 11, 2003

(54) METHOD FOR MANUFACTURING SEMICONDUCTOR DEVICE

(75) Inventor: Fumihiko Hirose, Kanagawa-ken (JP)

(73) Assignee: Mitsubishi Heavy Industries, Ltd., Tokyo (JP)

(*) Notice: Subject to any disclaimer, the term of this patent is extended or adjusted under 35 U.S.C. 154(b) by 0 days.

(21) Appl. No.: 09/951,433

(22) Filed: Sep. 14, 2001

(65) Prior Publication Data

US 2002/0142532 A1 Oct. 3, 2002

(30) Foreign Application Priority Data

Apr. 3, 2001 (JP) ........................................ 2001-104859

(51) Int. Cl.[7] ............................................. H01L 21/461
(52) U.S. Cl. ...................... 438/749; 438/750; 438/752; 438/312

(58) Field of Search ................................. 438/312, 745, 438/749, 750, 752, 906, 963

(56) References Cited

FOREIGN PATENT DOCUMENTS

| EP | 390606 | * | 3/1990 |
| EP | 1117133 | * | 7/2002 |
| JP | 2001-210654 | * | 8/2002 |

* cited by examiner

Primary Examiner—Trung Dang
(74) Attorney, Agent, or Firm—Wenderoth, Lind & Ponack, L.L.P.

(57) ABSTRACT

According to a method for manufacturing a semiconductor device having a junction boundary where SiGe of a first conductivity type and Si or SiGe of a second conductivity type come in contact with each other, a portion where the junction boundary is exposed on the surface is cleaned with a first solution containing hydrofluoric acid and is then cleaned with a second solution containing sulfuric acid.

10 Claims, 3 Drawing Sheets

S11
Substrate preparation

S12
SiGe film formation

S13
Pattern-etching

S14
Cleaning

S15
Electrode formation

S16
Dicing

S21
Substrate preparation
FIG. 3A
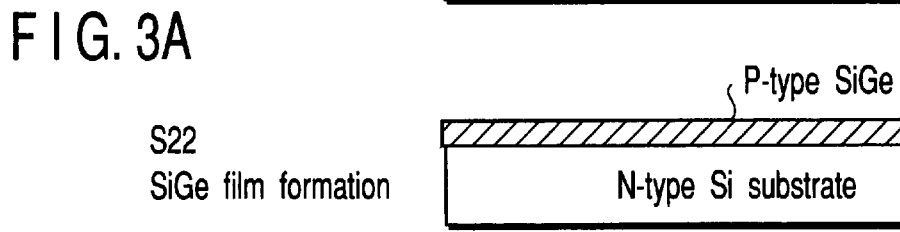
S22
SiGe film formation
FIG. 3B
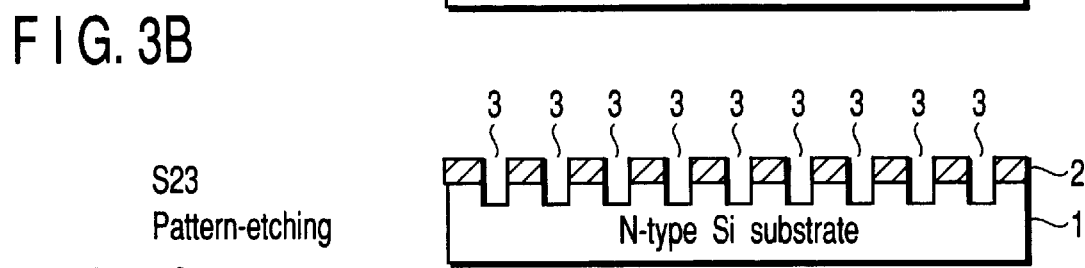
S23
Pattern-etching
FIG. 3C
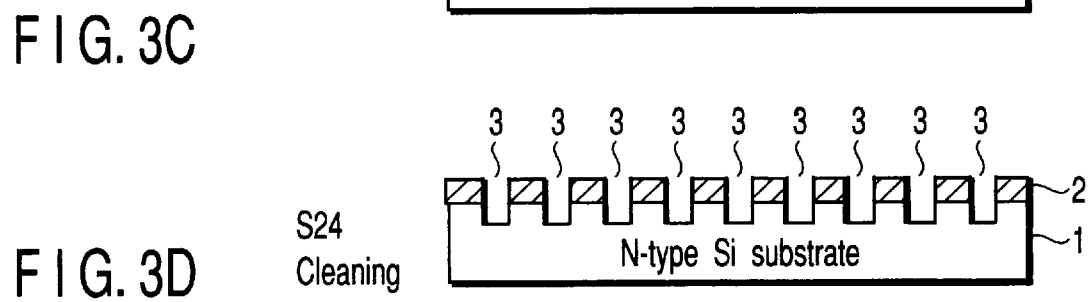
S24
Cleaning
FIG. 3D
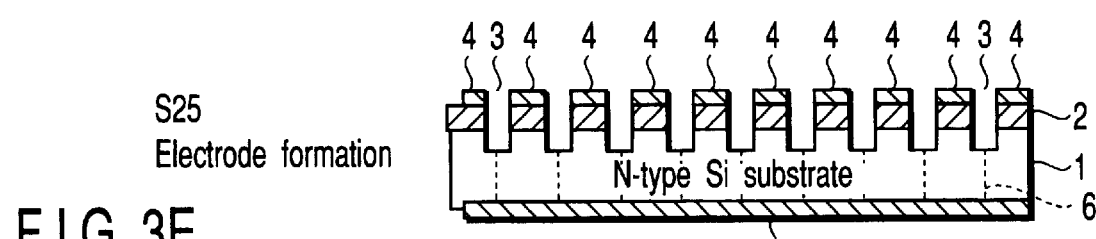
S25
Electrode formation
FIG. 3E
S26
Dicing
FIG. 3F
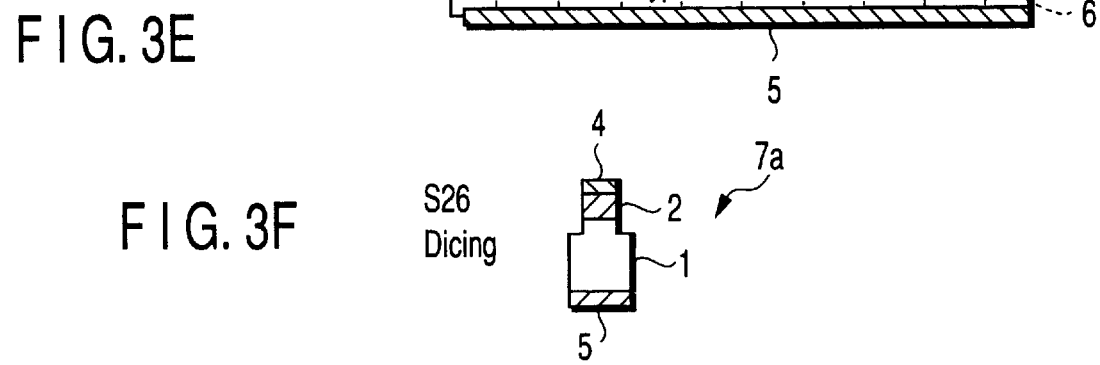
S27
Insulation coating
FIG. 3G
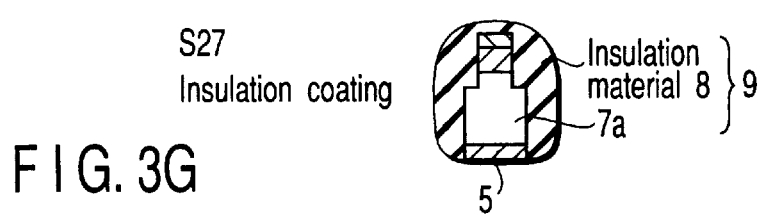

METHOD FOR MANUFACTURING SEMICONDUCTOR DEVICE

CROSS-REFERENCE TO RELATED APPLICATIONS

This application is based upon and claims the benefit of priority from the prior Japanese Patent Application No. 2001-104859, filed Apr. 3, 2001, the entire contents of which are incorporated herein by reference.

BACKGROUND OF THE INVENTION

1. Field of the Invention

The present invention relates to a method for manufacturing a semiconductor device such as a diode or a transistor which utilizes SiGe.

2. Description of the Related Art

An SiGe mixed crystal film is used to form an electronic device in which the SiGe mixed crystal film is joined to Si, for example, a device which has a structure in which n-type Si, p-type SiGe, and n-type Si are sequentially joined to each other, that is, a heterojunction bipolar transistor. The transistor exhibits excellent high-frequency characteristics superior to a transistor with a structure using Si alone. Accordingly, the SiGe mixed crystal film is lately becoming widespread in integrated circuits for high frequency. The present inventors disclosed the following fact in the specification and the drawings of Jpn. Pat. Appln. No. 2000-044306 (hereinafter referred to as the prior patent application). That is, in a diode in which p-type SiGe is joined to n-type Si, recovery time required when the application of bias is changed from the normal direction to the reverse direction is shorter than that of a conventional Si diode, so that a high-speed operation can be realized.

As for the heterojunction transistor or diode utilizing the SiGe mixed crystal film having such characteristics, from the viewpoints of improving the yield and increasing the range of uses, manufacturers strongly demand that breakdown voltage characteristics rise. The diode structure near to a portion where a breakdown voltage is applied, that is, the structure in which p-type SiGe is joined to n-type Si, or the structure in which n-type SiGe is joined to p-type Si will be referred to as an SiGe/Si diode. In the SiGe/Si diode, a leakage current becomes a problem when reverse bias is applied on the pn junction boundary (interface)

A leakage current generated in a conventional SiGe/Si diode will now be described with reference to FIG. 1. FIG. 1 schematically shows a leakage current 17 generated when reverse bias is applied to an SiGe/Si diode 10. When reverse bias is applied to the diode 10, as shown in the diagram, a depletion layer 13 is formed in an area including a pn junction boundary 18 and an electric field concentrates on the depletion layer 13. Portions 16 where the diode is exposed exist on the pn junction boundary 18. A depletion layer 13a in each exposed portion 16 tends to be narrower than the depletion layer 13 excluding the layer 13a.

Consequently, the degree of electric field concentration rises in the exposed portion 16 and the leakage current 17 generated in the diode remarkably depends on the substance characteristics of the exposed portion 16.

Specifically, the substance characteristics of the exposed portion 16 controlling the leakage current 17 include a crystal defect, air discharge, and impurities in the exposed portion 16. Among them, the crystal defect depends on a process of manufacturing semiconductor layers. Since attention is sufficiently paid to the quality management of the semiconductor manufacturing process so as to inhibit a crystal defect as much as possible, the crystal defect does not generally grow so severely that it cannot be ignored by itself.

However, effective countermeasure against impurities is not found so far, though the above two disadvantages have been effectively inhibited. As elements serving as impurities causing the leakage current 17, metals such as Na, K, Fe, and Au and impurities such as hydrocarbon and the like which exist in the atmosphere or which are adhered upon cleaning with water are mentioned. When the exposed portion 16 is oxidized to form Ge oxide on the surface, the oxide also causes the leakage current 17. Accordingly, to reduce the leakage current 17, a process of suppressing crystal defect, suppressing air discharge, and sufficiently reducing harmful impurities causing the leakage current 17 is required in the exposed portion 16.

In the conventional diode constructed by Si as a whole, generally, the exposed portion 16 on the pn junction boundary is subjected to a thermal oxidation treatment. That is, the surface of the diode is oxidized in an atmosphere of oxygen or water vapor at a high temperature of 900° C. or more. When the thermal oxidation treatment is performed, Si of the exposed portion 16 is oxidized to be insulated, so that the leakage current 17 is reduced. Although the thermal oxidation method is not effective against metal impurities, it is effective in an Si-based device. The thermal oxidation method is often used in the Si-based device so far.

When the conventional thermal oxidation method is applied to the SiGe/Si diode as it is, Ge is segregated on the interface between SiGe and an oxidized layer formed on the surface of SiGe. The segregation causes the leakage current 17. Ge oxide (GeO, $GeO_2$) has high conductive properties. The Ge oxide itself also becomes a cause of the leakage current 17. Accordingly, to perform the thermal oxidation method to SiGe, searches and researches with much labor regarding oxidizing conditions that Ge is not segregated are needed. Effective means is not found so far and the problem is left outstanding.

The problems of the foregoing conventional technique are concerned with the heterojunction boundary of the SiGe/Si diode. The junction boundary of an SiGe/SiGe diode also has the similar problems.

BRIEF SUMMARY OF THE INVENTION

It is an object of the present invention to provide a method for manufacturing a semiconductor device in which a leakage current is not generated on an SiGe/Si heterojunction boundary or an SiGe/SiGe junction boundary, particularly, an exposed portion thereof.

According to a first aspect of the present invention, there is provided a method for manufacturing a semiconductor device having a junction boundary where SiGe of a first conductivity type and Si or SiGe of a second conductivity type come in contact with each other, the method comprising the steps of: cleaning a portion, where the junction boundary is exposed on the surface, with a first solution containing hydrofluoric acid; and cleaning the portion with a second solution containing sulfuric acid.

When an exposed portion on the surface of the junction boundary of an SiGe/Si diode is left in the atmosphere, it is oxidized spontaneously. In this instance, as impurities, adsorption of impurities (such as hydrocarbon and the like) in the atmosphere and mixing of metal (Na, K) ions given on contact with the operator's bare hands are expected, and furthermore, an impurity such as Ge oxide ($GeO_2$), which is formed by oxidizing Ge, is expected. The impurities cause a leakage current, resulting in deterioration of breakdown voltage characteristics of the semiconductor device.

The first aspect of the present invention is concerned with the method for effectively eliminating impurities on the surface layer. According to the first aspect of the invention, first immersing the SiGe/Si diode in the first solution containing hydrofluoric acid eliminates oxide formed on the exposed portion. When the oxidized layer has a thickness of several microns, it can be easily eliminated so long as time to immerse in the hydrofluoric acid solution is changed. Due to the cleaning treatment, the junction boundary is terminated with hydrogen on the surface of the exposed portion. In the process, however, hydrocarbon and metal impurities are not eliminated.

Subsequently, when the SiGe/Si diode is immersed in the second solution (solution containing sulfuric acid), the metal impurities and hydrocarbon dissolve in the solution to be removed from the surface layer. At that time, the surface layer is oxidized at a thickness of about 1 nm (10Å). In this instance, $SiO_2$ alone is formed and Ge oxide ($GeO_2$) is not formed. A Ge atom on the surface layer is oxidized due to influences of sulfuric acid. Since Ge oxide dissolves in the sulfuric acid solution, $GeO_2$ is not left on the surface layer. On the surface layer obtained in this case, impurities such as metal, hydrocarbon, and Ge oxide are reduced. In addition, Si oxide is formed thin on the surface layer. The Si oxide is inert to impurities given from the outside and functions to inhibit the adsorption of impurities, which will occur later.

According to the first aspect of the invention, the treatment with hydrofluoric acid and the treatment with sulfuric acid are sequentially performed. When either of them is not performed, advantages of the present invention are not achieved. In a case where the treatment with hydrofluoric acid is not performed, when a spontaneously oxidized film on the surface layer is thick, $GeO_2$ in the spontaneously oxidized film is not sufficiently eliminated and metal impurities contained in the spontaneously oxidized film cannot be eliminated. On the other hand, when the treatment with sulfuric acid is not performed, metal impurities and hydrocarbon, which cannot be removed by the treatment with hydrofluoric acid, are remained. When the treatment with hydrofluoric acid and the treatment with sulfuric acid are performed in inverse order, the surface is terminated with hydrogen. Consequently, as compared with the diode according to the present invention, in which the surface is terminated with the oxidized film, advantages for inhibiting the adsorption of impurities, which will occur later, are weakened.

According to a second aspect of the present invention, there is provided a method for manufacturing a semiconductor device having a junction boundary where SiGe of a first conductivity type and Si or SiGe of a second conductivity type come in contact with each other, the method comprising the steps of: etching the surface of a portion, where the junction boundary is exposed, with a first solution; cleaning the portion with a second solution containing hydrofluoric acid; cleaning the portion with a third solution containing sulfuric acid; and coating the portion, where the junction boundary is exposed on the surface, with an insulating material.

As mentioned above, 1) a crystal defect, 2) air discharge, and 3) impurities in the exposed portion on the surface of the junction boundary become causes of the leakage current generated when reverse bias is applied to the SiGe/Si diode.

According to the second aspect of the invention, a treatment of eliminating 1) the crystal defect and a treatment of eliminating 2) the air discharge are added to the method according to the first aspect of the invention. According to the second aspect of the invention, there is provided a diode with lower leakage current.

Specifically, to eliminate the crystal defect on the semiconductor surface, the surface layer is etched with a chemical etching agent as a first solution, e.g., an aqueous alkaline solution such as KOH or an aqueous mixed solution of hydrofluoric acid and sulfuric acid. Consequently, the crystal defect caused by scratches or surface damage due to a treatment with plasmas can be eliminated. After that, to eliminate impurities, the diode is immersed in the solution containing hydrofluoric acid (second solution) and the solution containing sulfuric acid (third solution), which are used in the first aspect of the invention, in the order to be washed. Furthermore, the surface layer of the diode is coated with an insulating material such as gelled silicone (for example, silicone gel made by Shinetsu Silicone Co.) to prevent the surface from coming in contact with the air. Consequently, the occurrence of air discharge is inhibited. Accordingly, the SiGe/Si diode with slight performance degradation due to the leakage current can be obtained by combining the above three treatments.

Although the above treatments have been described with respect to the example of the SiGe/Si diode, the similar advantages can be also achieved in the SiGe/SiGe diode.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIGS. 3A to 3G show a flowchart showing a method for manufacturing a semiconductor device according to a second example of the present invention.

DETAILED DESCRIPTION OF THE INVENTION

Various preferred embodiments of the present invention will be described hereinbelow with reference to the accompanying drawings.

EXAMPLE 1

As a semiconductor device of Example 1, a p-SiGe/n-Si junction diode was manufactured. A method for manufacturing thereof will be described with reference to FIGS. 2A to 2F.

Figure 1:
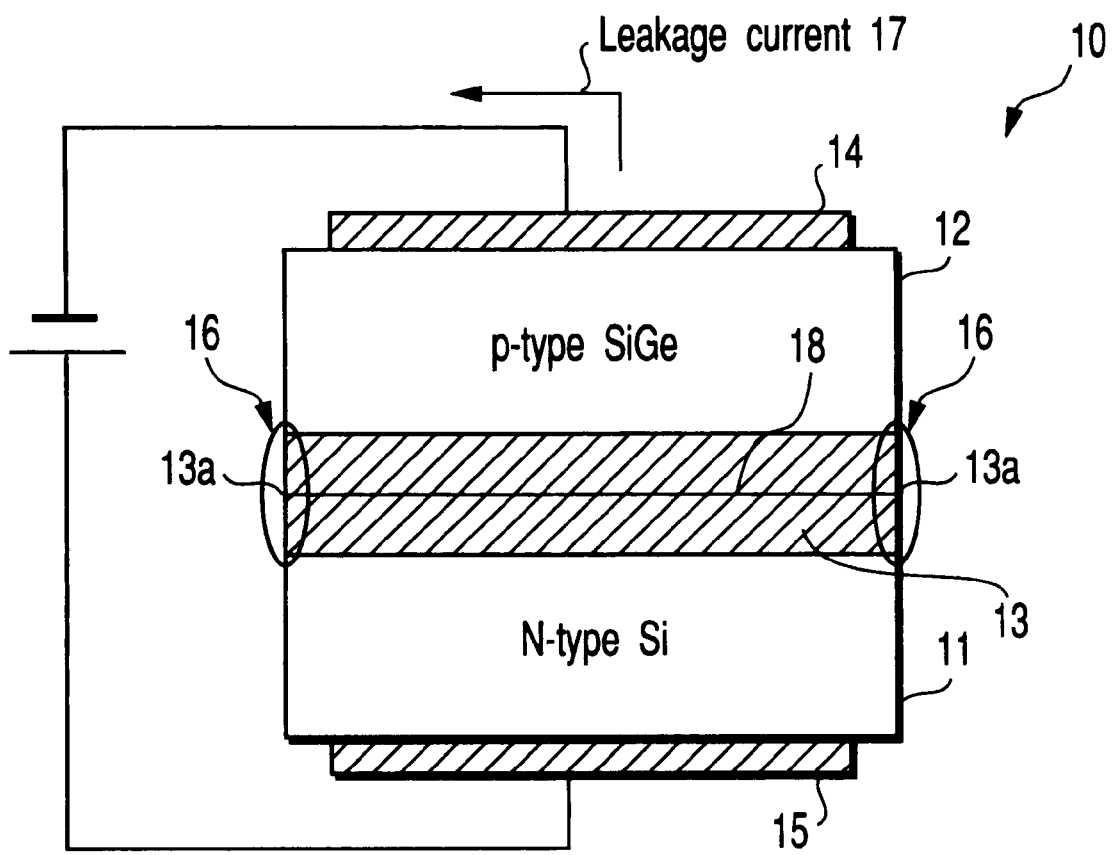
FIG. 1 is a schematic cross-sectional view showing a semiconductor device.
Figure 2A:
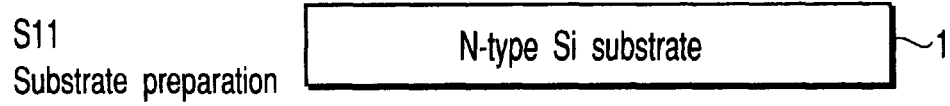
FIGS. 2A to 2F show a flowchart showing a method for manufacturing a semiconductor device according to a first example of the present invention.
Figure 2B:
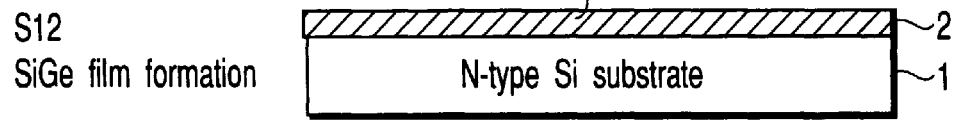

An n-type Si substrate 1 shown in FIG. 2A was prepared (step S11). The film resistance of the Si substrate 1 was equal to 15 Ωcm. As shown in FIG. 2B, a p-type SiGe film 2 was formed on the n-type Si substrate 1 at a thickness of 0.4 μm (step S12). To form the p-type SiGe film 2, a chemical vapor deposition method (CVD) or the like was used. The concentration of a p-type dopant in the SiGe film 2 was on the order of 1017 cm$^{-3}$. Each exposed portion 3 on the substrate was formed in such a manner that the width was set to 1 mm, depth was set to 30 μm, pitch interval between the exposed portions was set to 1.5 to 5 mm. The concentration of Ge in the SiGe film 2 was set to 5 atomic percentage.

Figure 2C:

Subsequently, the SiGe film 2 was patterned and etched by etching means, so that many holes were formed. Consequently, the patterned exposed portions 3 on the substrate were formed as shown in FIG. 2C (step S13). Each of the exposed portions 3 on the substrate was formed in such a manner that the width was set to 1 mm, depth was set to 30 μm, pitch interval between the exposed portions was set to 1.5 to 5 mm. Each portion, where the SiGe film 2 was left, served as a product diode.

As the etching means in step S13, either dry etching or wet etching can be used. In case of the dry etching, it is preferable to use a reactive ion etching method utilizing an etching gas such as a mixed gas of $CF_4$ and $O_2$. In case of the wet etching, either an acid solution or an alkaline solution can be used. In the former solution, a masking material (not shown) is adhered onto the surface of the SiGe film 2 and the SiGe/Si lamination is immersed in a mixed solution of three kinds of acetic acid+nitric acid+hydrofluoric acid (3:5:3) at room temperature. In the latter solution, a masking material (not shown) is adhered onto the surface of the SiGe film 2 and the SiGe/Si lamination is immersed in a potassium hydroxide solution (10% KOH solution) by heating (at about 60° C.).

After pattern-etching, the SiGe/Si lamination was rinsed with water and was then dried. Subsequently, the SiGe/Si lamination was immersed in a hydrofluoric acid solution at room temperature to perform a first cleaning treatment (the first half of step S14). The hydrofluoric acid solution used in the first cleaning treatment was formed by diluting hydrofluoric acid having a concentration of 48 wt % with water to 1/50. After the first cleaning treatment, the SiGe/Si lamination was rinsed with water and was then dried.

Subsequently, the SiGe/Si lamination was immersed in a sulfuric acid solution at room temperature to perform a second cleaning treatment (the second half of step S14). The sulfuric acid solution used in the second cleaning treatment was formed by mixing a 96 wt % aqueous sulfuric acid solution with a 48 wt % aqueous hydrogen peroxide solution in a ratio of 1:2.

Figure 2D:
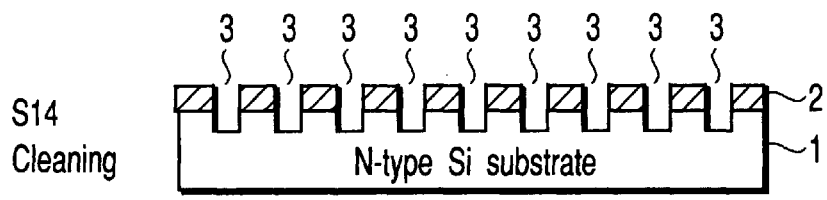

The first and second cleaning treatments (two-step cleaning treatment) eliminated impurities from the exposed portions of the heterojunction boundary of the SiGe/Si lamination. As shown in FIG. 2D, the SiGe/Si lamination having a clean surface was obtained.

Figure 2E:
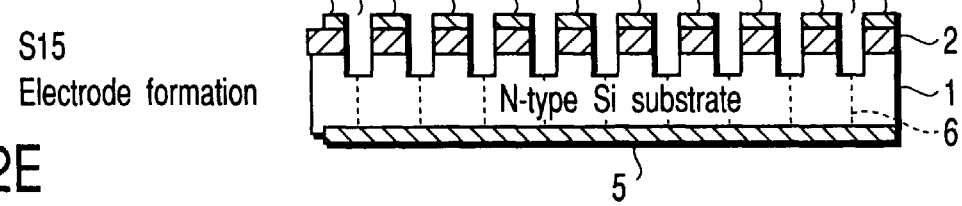
Figure 2F:
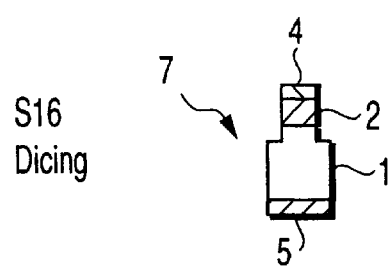

After that, as shown in FIG. 2E, metal electrodes 4 and 5 were formed on the upper and lower surfaces of the SiGe/Si lamination by a vacuum evaporation method, respectively (step S15). The SiGe/Si lamination was cut along cutting lines 6. Finally, a diode 7 shown in FIG. 2F was completed (step S16). The number of diodes 7 formed in this case was set to 50.

Evaluation

Reverse bias was applied to the manufactured diodes 7 to measure leakage currents 17 in the respective cases. The leakage current 17 tends to increase according to a reverse bias voltage. In this case, a voltage obtained when the leakage current 17 was equal to 1 mA was defined as a breakdown voltage of the diode. The magnitude of the leakage current 17 was evaluated on the basis of the magnitude of voltage value.

Consequently, the mean of the breakdown voltages of the 50 diodes 7 (samples of Example 1) was equal to 250V. When 200V was set to a threshold value, the breakdown voltage of each of the samples of Example 1 was equal to or higher than the threshold value.

50 diodes (samples of Comparative example 1), which were not subjected to the foregoing first and second cleaning treatments, were formed. The mean of the breakdown voltages of the samples of Comparative Example 1 was equal to or lower than 100V.

50 diodes (samples of Comparative example 2), which were not subjected to the first cleaning treatment (treatment with hydrofluoric acid) but were subjected to the second cleaning treatment (treatment with sulfuric acid), were formed. The mean of the breakdown voltages of the samples of Comparative example 2 was equal to 200V.

Furthermore, 50 diodes (samples of Comparative example 3), which were subjected to the first cleaning treatment (treatment with hydrofluoric acid) alone and were not subjected to the second cleaning treatment (treatment with sulfuric acid), were manufactured. The mean breakdown voltage of the sample according to Comparative example 3 was equal to 200V. The value was not so different from that of the above sample.

However, undoubtedly defectives having a breakdown voltage of lower than 100V were formed as much as 4%. When the characteristics of the defective was analyzed, V-I characteristics, assumed they were caused due to the influences of moving ions contained in metal impurities, were observed. Consequently, it was confirmed that the metal impurities were not sufficiently eliminated.

Example 2

A case where a diode whose type is different from that of the above diode is fabricated as a semiconductor device of Example 2 will now be described with reference to FIGS. 3A to 3G.

The n-type Si substrate 1 shown in FIG. 3A was prepared (step S21). The film resistance of the Si substrate 1 was equal to 15 Ωcm. As shown in FIG. 3B, the p-type SiGe film 2 was formed on the n-type Si substrate 1 at a thickness of 0.4 μm (step S22). Forming the p-type SiGe film 2 used the chemical vapor deposition method or the like. The concentration of a p-type dopant in the SiGe film 2 was on the order of $10^{17}$ cm$^{-3}$. The concentration of Ge of the SiGe film 2 was set to 5 atomic percentage.

Then, the SiGe film 2 was patterned and etched by etching means, so that many holes were formed. Consequently, as shown in FIG. 3C, the patterned exposed portions 3 on the surface were formed (the first half of step S23). Each of the exposed portions 3 on the surface was formed in such a manner that the diameter was set to 1 mm, depth was set to 30 μm, pitch interval between the exposed portions was set to 1.5 to 5 mm. Furthermore, the patterned substrate was immersed in a solution formed by mixing a 48% aqueous hydrofluoric acid solution, a 70% aqueous nitric acid solution, and pure water in a ratio of 1:1:10 for about 20 seconds to etch the surface (the second half of step S23).

As the etching means in step S23, either dry etching or wet etching can be used. In case of the dry etching, it is preferable to use a reactive ion etching method utilizing an etching gas such as a mixed gas of $CF_4$ and $O_2$. In case of the wet etching, either an acid solution or an alkaline solution can be used. In case of the former solution, a masking material (not shown) is adhered on the surface of the SiGe film 2 and the SiGe/Si lamination is immersed in a mixed solution of three kinds of acetic acid+nitric acid+ hydrofluoric acid (3:5:3) at room temperature. In case of the latter solution, a masking material (not shown) is adhered onto the surface of the SiGe film 2 and the SiGe/Si lamination is then immersed in a potassium hydroxide solution (10% KOH solution) by heating (at about 60° C.).

After the pattern-etching, the SiGe/Si lamination was washed with water and was then dried. Subsequently, the SiGe/Si lamination was immersed in a hydrofluoric acid solution at room temperature to perform a first cleaning treatment (the first half of step S24). The hydrofluoric acid solution used in the first cleaning treatment was obtained by diluting hydrofluoric acid having a concentration of 48 wt % with water to 1/50. After the first cleaning treatment, the SiGe/Si lamination was washed with water and was then dried.

Subsequently, the SiGe/Si lamination was immersed in a sulfuric acid solution at room temperature to perform a second cleaning treatment (the second half of step S24). The sulfuric acid solution used in the second cleaning treatment was obtained by mixing a 96 wt % aqueous sulfuric acid solution with a 48 wt % aqueous hydrogen peroxide solution in a ratio of 1:2.

The first and second cleaning treatments (two-step cleaning treatment) eliminated impurities from the exposed portions of the heterojunction boundary of the SiGe/Si lamination. Consequently, as shown in FIG. 3D, the SiGe/Si lamination having a clean surface was obtained.

After that, as shown in FIG. 3E, the metal electrodes 4 and 5 were formed on the upper and lower surfaces of the SiGe/Si lamination by the vapor deposition method, respectively (step S25). Subsequently, the SiGe/Si lamination was cut along the cutting lines 6 to be separated into chips 7a, as shown in FIG. 3F (step S26).

Then, as shown in FIG. 3G, the whole chip 7a excluding the lower electrode 5 was coated with an insulating material 8 to form a diode 9 insulated by coating (step S27). The number of diodes 9 formed in this case was set to 20. As the insulating material 8, gelled silicone (silicone gel made by Shinetsu Silicone Co.) was used. In addition to silicone, a polyimide film can be also used as the insulating material 8.

Evaluation

Reverse bias was applied to the diodes 9 (samples of Example 2) to measure the leakage currents 17 in the respective cases. Evaluating conditions of Example 2 were the same as those of Example 1. Consequently, the mean breakdown voltage of the sample 9 of Example 2 was equal to 280V. The sample 9 of Example 2 having a breakdown voltage of 200V or lower did not appear.

As a comparative example, 20 diodes (samples of Comparative example 4), which were not subjected to the surface etching (step S24) and the insulation coating (step S27), were formed. The mean breakdown voltage of the sample of Comparative example 4 was equal to 250V. Thus, the efficiencies of the treatment methods performed in Example 2 were confirmed.

According to the present invention, the leakage current generated on the SiGe/Si heterojunction boundary is effectively prevented. Accordingly, the quality of the semiconductor device such as diode or bipolar transistor having the SiGe/Si heterojunction boundary is improved and the yield of the semiconductor device is also improved. According to the present invention, the leakage current generated on the SiGe/SiGe junction boundary is also effectively prevented. Consequently, the range of uses of the SiGe mixed crystal film in the semiconductor device is increased.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for manufacturing a semiconductor device having a junction boundary where SiGe of a first conductivity type and Si or SiGe of a second conductivity type come in contact with each other, the method comprising the steps of:

cleaning a portion, where the junction boundary is exposed on a surface, with a first solution containing hydrofluoric acid; and cleaning the portion with a second solution containing sulfuric acid.

2. The method according to claim 1, wherein the second conductivity type Si or SiGe comprises an n-type Si substrate or an n-type SiGe substrate, the first conductivity type SiGe comprises an SiGe film formed on the substrate by the use of a chemical vapor deposition method, and the SiGe film of the first conductivity type is patterned and etched, and afterward, the exposed portion of the junction boundary is cleaned with the first and second solutions.

3. The method according to claim 1, wherein the first solution is obtained by diluting hydrofluoric acid having a concentration of 48 wt % with water up to 1/50.

4. The method according to claim 1, wherein the second solution is obtained by mixing a 96 wt % aqueous sulfuric acid solution with a 48 wt % aqueous hydrogen peroxide solution in a ratio of 1:2.

5. A method for manufacturing a semiconductor device having a junction boundary where SiGe of a first conductivity type and Si or SiGe of a second conductivity type come in contact with each other, the method comprising the steps of:

etching the surface of a portion, where the junction boundary is exposed on the surface, with a first solution;

cleaning the portion with a second solution containing hydrofluoric acid;

cleaning the portion with a third solution containing sulfuric acid; and coating the portion, where the junction boundary is exposed on the surface, with an insulating material.

6. The method according to claim 5, wherein the second conductivity type Si or SiGe comprises an n-type Si substrate or an n-type SiGe substrate, the first conductivity type SiGe comprises an SiGe film formed on the substrate by the use of a chemical vapor deposition method, and the SiGe film of the first conductivity type is patterned and etched to expose the junction boundary on the surface, so that the exposed surface of the junction boundary is etched with the first solution.

7. The method according to claim 5, wherein the first solution is obtained by mixing a 48% aqueous hydrofluoric acid solution, a 70% aqueous nitric acid solution, and pure water in a ratio of 1:1:10.

8. The method according to claim 5, wherein the second solution is obtained by diluting hydrofluoric acid having a concentration of 48 wt % with water to 1/50.

9. The method according to claim 5, wherein the third solution is obtained by mixing a 96 wt % aqueous sulfuric acid solution with a 48 wt % aqueous hydrogen peroxide solution in a ratio of 1:2.

10. The method according to claim 5, wherein the insulating material composes gelled silicone.

* * * * *